United States Patent [19]
Chen et al.

[11] Patent Number: 5,491,600
[45] Date of Patent: Feb. 13, 1996

[54] MULTI-LAYER CONDUCTOR LEADS IN A MAGNETORESISTIVE HEAD

[75] Inventors: Mao-Min Chen, San Jose; Mary K. Gutberlet, Salinas; Mohamad T. Krounbi; Jacqueline K. Latimer, both of San Jose; Mustafa Pinarbasi, Morgan Hill, all of Calif.

[73] Assignee: International Business Machines Corporation, Armonk, N.Y.

[21] Appl. No.: 237,744

[22] Filed: May 4, 1994

[51] Int. Cl.$^6$ ............................. G11B 5/127; G11B 5/33
[52] U.S. Cl. .......................................... 360/113
[58] Field of Search .............................. 360/113

[56] References Cited

U.S. PATENT DOCUMENTS

| | | | |
|---|---|---|---|
| 4,809,109 | 2/1989 | Howard et al. | 360/113 |
| 5,005,096 | 4/1991 | Krounbi et al. | 360/113 |
| 5,109,310 | 4/1992 | Ohkjita et al. | 360/106 |
| 5,262,914 | 11/1993 | Chen et al. | 360/113 |
| 5,327,313 | 7/1994 | Nishioka et al. | 360/113 |
| 5,341,261 | 8/1994 | Dieny et al. | 360/113 |

*Primary Examiner*—A. J. Heinz
*Assistant Examiner*—Adriana Giordana
*Attorney, Agent, or Firm*—Leslie G. Murray; Craig J. Yudell; Andrew J. Dillon

[57] ABSTRACT

A magnetoresistive sensor includes a magnetoresistive material, formed on a substrate, and having a first edge and a second edge. A first multilayered conductive lead structure is electrically connected to the first edge, and a second multilayered conductive lead structure is electrically connected to the second edge. The first and second conductive lead structures are constructed of multiple layers of thin film materials that alternate between at least one layer of a thin film of a refractory metal interlaid between at least two thin film layers of a highly conductive metal.

20 Claims, 13 Drawing Sheets

| Ta | / | Au | / | Ta | / | Au | / | Ta | / | Au | / | Ta | / | Au | / | Ta |
|---|---|---|---|---|---|---|---|---|---|---|---|---|---|---|---|---|
| 1) — | / | 1800A° | / | — | / | | | | | | | | | | | |
| 2) 50A° | / | 1000A° | / | 50A° | / | | | | | | | | | | | |
| 3) 50A° | / | 275A° | / | 50A° | / | 275A° | / | 50A° | / | 275A° | / | 50A° | / | 275A° | / | 50A° |
| 4) 50A° | / | 200A° | / | 50A° | / | 200A° | / | 50A° | / | 200A° | / | 50A° | / | 200A° | / | 50A° |

MULTI-LAYER CONDUCTOR LEADS IN A MAGNETORESISTIVE HEAD

BACKGROUND OF THE INVENTION

1. Technical Field:

The present invention relates in general to conductor lead structures in a magnetoresistive sensor, and in particular to a multi-layered conductor lead structure of alternating refractory and conducting layers in a magnetoresistive sensor.

2. Description of the Related Art:

A magnetic transducer, often referred to as a magnetoresistive (MR) sensor head, is utilized as part of a magnetic data storage and recording media. An MR sensor is capable of reading data from a magnetic surface at high linear densities. It detects magnetic field signals through the resistance changes of a read element made from a magnetoresistive material as a function of the amount and direction of magnetic flux being sensed by the element.

In addition to the magnetoresistive material, the MR sensor has conductive lead structures connected to the MR film which sense the resistance variations that occur while reading out data. Typically, a constant current is sent through the MR film and the voltage variations caused by the changing resistance is measured via these leads.

The preferred material for constructing these leads is a highly conductive material such as a metal. In the MR conductor lead application, these materials face much more stringent requirements when compared to other interconnect conductors, such as for semiconductor devices. This is because the conductor lead, as well as the MR thin film, is exposed at the head's air bearing surface (ABS). The lead has little protection from the severe mechanical environment where head-disk contact occurs frequently, and from the severe corrosion environment where chemical attack occurs both during processing and also in actual use where the environment may not be well controlled.

The early MR heads were fabricated using pure gold metallurgy and other highly conductive materials as the lead conductor. However, due to the exposure at the air bearing surface, these soft metals had the potential reliability risk of electromigration, smearing and nodule formation. Tungsten was introduced as a gold substitute due to its mechanical properties of being very hard and its good electrical conductivity which was approximately 15 micro-ohm-cm in thin-film form.

The introduction of tungsten to the MR process solved the mechanical issues associated with the lead metallurgy but posed a more serious corrosion problem at the air bearing surface during the lapping process. The combination of magnesium-iron as an exchange layer (highly corrosive in acid solution) and tungsten as the conductor layer (highly corrosive in basic solutions) would require a neutral lapping solution free from ion contamination. This has been proven to be near impossible to maintain.

Although the current technology has provided satisfactory results, development of MR heads capable of reading magnetic disks of significantly denser data is being pursued. The higher the bit density to be read by the MR head, the thinner the MR thin film must be; for example, future MR heads with nickel-iron (NiFe) thin films will have thin-film thicknesses of 250 Å or less. The processes for making the thin film materials that comprise the active sensing region of the MR head are producing thinner and thinner sensors.

The problem with current lead conductor materials, such as titanium-tungsten/tantalum, when used with these modern thin-film MR heads, is that given their minimum resistivity values of 20 micro-ohm-cm or more, their thickness must be around 2000 Å in order to achieve acceptable sheet resistance values of less then 1.5 ohms/sq. When the relatively thick titanium-tungsten/tantalum leads are used with high bit-density thin films of 250 Å or less, a large surface topography is induced at the edges of the active region of the MR head.

Moreover, when the MR read head is merged with an inductive write head, succeeding layers of the write head are deposited over the MR elements and conductor leads to form the write head. The large surface topography causes a curve in the two inductive poles of the write head, resulting in a higher read error rate for the MR head.

To eliminate the topography, stitched leads processes have been developed and implemented where the lead thickness at the ABS is 1200 Å. However, even further reduction in lead thickness, perhaps down to 700 Å, is required for high bit-density MR heads with MR thin film thicknesses of less than 250 Å. Moreover, it is also desirable to eliminate the extra photolithographic and deposition steps required by stitched leads.

Therefore, it would be desirable to provide an MR conductor leads structure which approximates the thickness of the active region of the MR head to minimize surface topography, while maintaining acceptable resistance values. Moreover, it would be desirable for this MR conductive leads structure to have enhanced mechanical strength and stability in order to resist nodule growth and smearing.

SUMMARY OF THE INVENTION

It is therefore one object of the present invention to provide a very thin and highly conductive MR conductive leads structure that has enhanced mechanical strength and stability in order to resist nodule growth and smearing.

It is another object of the present invention to provide an MR conductor leads structure which approximates the thickness of the active region of the MR head to minimize surface topography, while maintaining acceptable resistance values.

The foregoing objects are achieved as is now described. According to the present invention, a magnetoresistive sensor includes a magnetoresistive material, formed on a substrate, and having a first edge and a second edge. A first multilayered conductive lead structure is electrically connected to the first edge, and a second multilayered conductive lead structure is electrically connected to the second edge. The first and second conductive lead structures are constructed of multiple layers of thin film materials that alternate between at least one layer of a thin film of a refractory metal interlaid between at least two thin film layers of a highly conductive metal.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
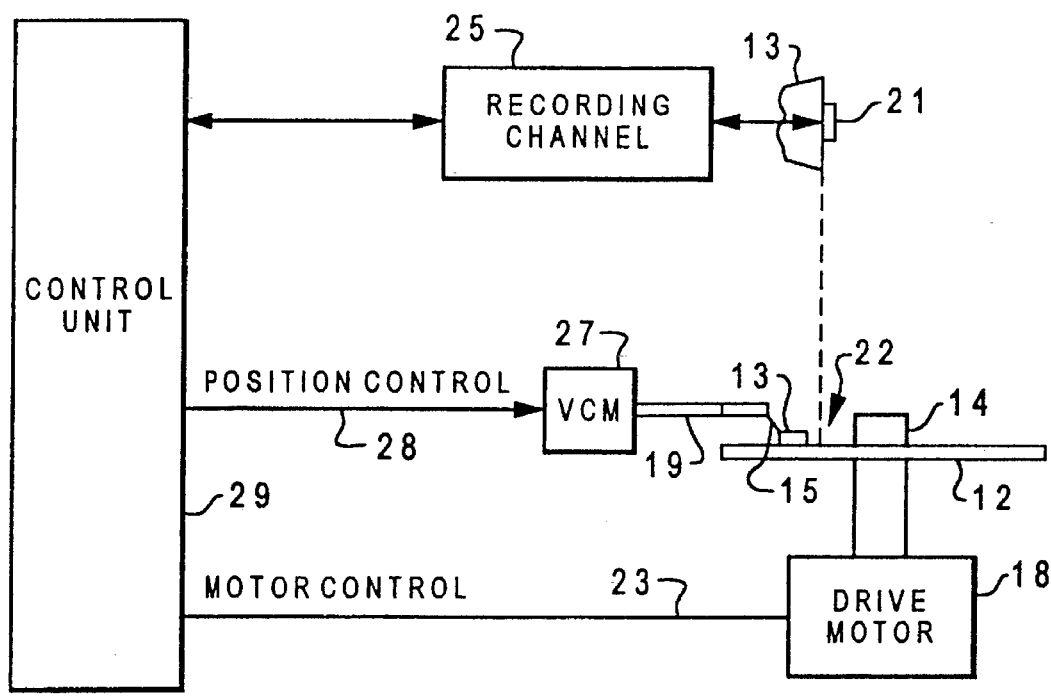
FIG. 1 depicts a magnetic disk storage system containing multi-layer conductor leads in a magnetoresistive head in accordance with the preferred embodiment of the present invention.

Although the present invention is described as embodied in the magnetic disk storage system as shown in FIG. 1, it will be apparent that the invention is also applicable to other magnetic recording systems such as a magnetic tape recording system, for example. Referring now to the figures, and in particular to FIG. 1, at least one rotatable magnetic disk 12 is supported on a spindle 14 and rotated by a disk drive motor 18. The magnetic recording media on each disk is in the form of an annular pattern of concentric data tracks (not shown) on disk 12.

At least one slider 13 is positioned on the disk 12, each slider 13 supporting one or more magnetic read/write heads 21. As disk 12 rotates, the sliders 13 are moved radially in and out so that the heads 21 may access different portions of the disk surface 22 containing the data. Each slider 13 is attached to an actuator arm 19 by means of a suspension 15. The suspension 15 provides a slight spring force which biases the slider 13 against the disk surface 22. Each actuator arm 19 is attached to an actuator means 27. The actuator means shown in FIG. 1 is a voice coil motor (VCM). The VCM is a coil movable within a fixed magnetic field, and the direction and velocity of the coil movements is controlled by the current supply. During operation of the disk storage system, the rotation of disk 12 generates an air bearing between slider 13 and the disk surface 22. The air bearing thus counterbalances the slight spring force of the suspension 15 and supports the slider 13 off the disk surface by small, substantially constant spacing during operation. The surface of heads 21 in contact with the air bearing is commonly known as the air bearing surface (ABS).

The various components of the disk storage system are controlled in operation by signals generated by control unit 29, such as access control signals and internal clock signals, and which includes logic control circuits, storage means and a microprocessor. The control unit 29 generates control signals to control various system operations such as motor control signals on line 23 and head position control signals on line 28. The control signals on line 28 provide the desired current profiles to optimally move and position a selected slider 13 to the desired data track on the associated disk 12. Read and write signals are communicated to and from read/write heads 21 by means of recording channel 25.

The above description of a typical magnetic disk storage system and the accompanying illustration of it in FIG. 1 are for representation purposes only. It should be apparent that disk storage systems may contain a large number of disks and actuators, and each actuator may support a number of sliders.

Figure 2:
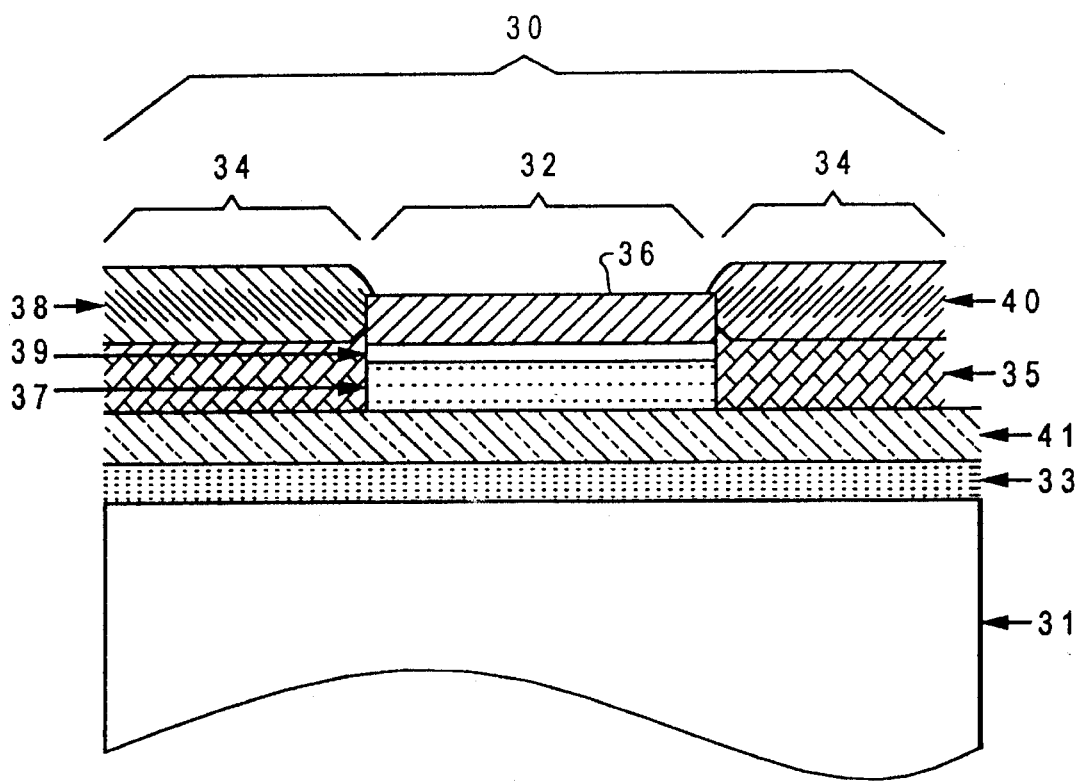
FIG. 2 depicts a specific embodiment of one type of a magnetoresistive read transducer assembly.

A specific embodiment of one type of magnetoresistive read transducer assembly will be described briefly in conjunction with FIG. 2. The magnetic read head utilizes a magnetoresistive (MR) sensor 30 produced on a suitable substrate 31. The MR sensor 30 can be divided into two regions, the central active region 32, where actual sensing of data is accomplished, and passive end regions 34. The distance between the inner edges of conductive lead structures 38 and 40 comprise the portion of the active region 32 over which the output signal is sensed. The two regions, end region 34 and active region 32, should be biased in different manners with longitudinal bias only in the end regions 34 and transverse bias in the active region 32. The longitudinal bias in the end regions 34 is produced by bias layer 35. Bias layer 35 may comprise either an antiferromagnetic material or a hard magnetic material such as CoPtCr. The resultant unidirectional anisotropy develops by means of exchange coupling across the interface between the MR layer and the hard bias layer and produces a shift of the MH loop of the MR layer which is usually called the longitudinal exchange bias field. This bias field extends parallel to the surface of the magnetic media and parallel to the lengthwise direction of the MR sensor. The function of the longitudinal bias field is to suppress Barkhausen noise, which originates from multidomain activities in the MR sensor. The transverse bias in the active region 32 is produced by a soft magnetic film layer 37 which is separated from the MR layer 36 by a thin non-magnetic spacer layer 39 whose purpose is to prevent, within the active central region, a magnetic exchange coupling between the MR layer 36 and the soft magnetic bias layer 37. Both bias layers are formed on top of insulator layer 41, composed of an oxidized metal, and shield layer 33, composed of a magnetic material.

Figure 3:
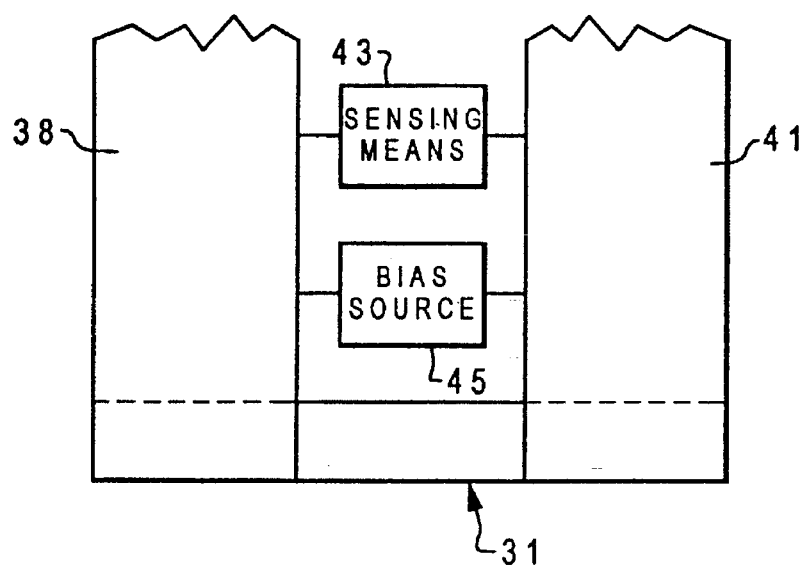
FIG. 3 depicts the electrical connections made with the conductive lead structures for a specific embodiment of a magnetoresistive read transducer assembly.

With reference now to FIG. 3, an output signal can be coupled out to sensing means 43, with the aid of conductive lead structures 38 and 40 which are electrically connected to the MR sensor 30. The voltage (or current) signal enables the sensing means 43 to determine the resistance changes in the active region 32 as a function of the magnetic fields which are intercepted by the MR sensor 30 from previously recorded data on a magnetic medium, for example. A bias source 45 is also connected to conductive lead structures 38 and 40 to supply a bias current which, in conjunction with soft magnetic bias film layer 37, as seen in FIG. 2, produces the transverse bias in the active regions 32, as is known in the art. Typically, sensing means 43 and bias source 45 may be incorporated in the read/write channel circuitry 25 (as shown in FIG. 1).

According to the present invention, at least one interlayer of a refractory metal is placed within the current carrying highly conductive metal layers of the conductive lead structure. This interlayer provides strength and stability to the lead structure to resist nodule formation. As the number of strengthening layers interlaid between layers of the highly conductive metal increases, the structure is further strengthened. However, the increased strength must be weighted against the increased resistance resulting from the greater ratio of refractory metal to conductive metal in the lead thickness. According to another aspect of the present invention, low resistivity alloys composed of gold, copper and silver are deposited for use as conductive layers. This allows the metals to be formed in very thin layers, while still maintaining a low sheet resistance.

According to a preferred embodiment of the present invention, conductive lead structures 38 and 41 are constructed of multiple thin film layers which alternate between layers of a refractory metal and layers of a highly conductive metal. The thin film layers of the highly conductive metal provide the principal current carrying elements of the conductive lead structures 38 and 41. The refractory metal layers are interlayered with the highly conductive layers to provide structural support to the relatively soft, highly conductive layers. This structural support provides the mechanical strength and stability needed to overcome the common problem of smearing and nodule growth.

In describing the preferred embodiment, it will be useful to describe a process for making the conductor lead structure of the present invention within an MR head. The following description is not intended to form a complete process flow for manufacturing an MR head. Only so much of the commonly practiced process steps are included as are necessary for an understanding of the present invention. The ion beam induced sputter deposition process used to produce the preferred embodiment of the conductor lead structures of the present invention is known in the art. Forming a thin film on a substrate utilizing ion beam sputtering are described, for example, in U.S. Pat. No. 4,923,585, to Krauss, et al. Improved ion beam sputtering process as applied to MR sensors and conductor lead materials have been described in U.S. patent application Ser. No. 07/876,603, filed Apr. 30, 1992, and is incorporated herein by reference.

Many conventional methods of depositing layers in conductive lead structures for MR heads cannot grow thin-films thin enough for future ultra-high density read/write applications. Methods well known in the art such as RF or DC magnatron sputter-deposition can form thin film layers of gold between 1200 Å to 2000 Å and having a minimum resistivity of 4–6 micro-ohm-cm. According to the present invention, the thin film gold and tantalum layers comprising the conductive lead structure are created by an ion beam sputtering process. Using this process, bulk resistivity values of 2.6 micro-ohm-cm are achieved. A reduction in the resistivity of the thin film layers by half reduces the total thickness of the conductor lead structure by a factor of two, while retaining an equivalent sheet resistance. This allows multi-layered conductive lead structures to be built at thicknesses between 600 to 900 Å, while attaining sheet resistances of less than 1 ohm/sq. At these levels, the conductor lead structures can be built to closely approximate the active region thickness seen in high density MR head applications.

Figure 4:
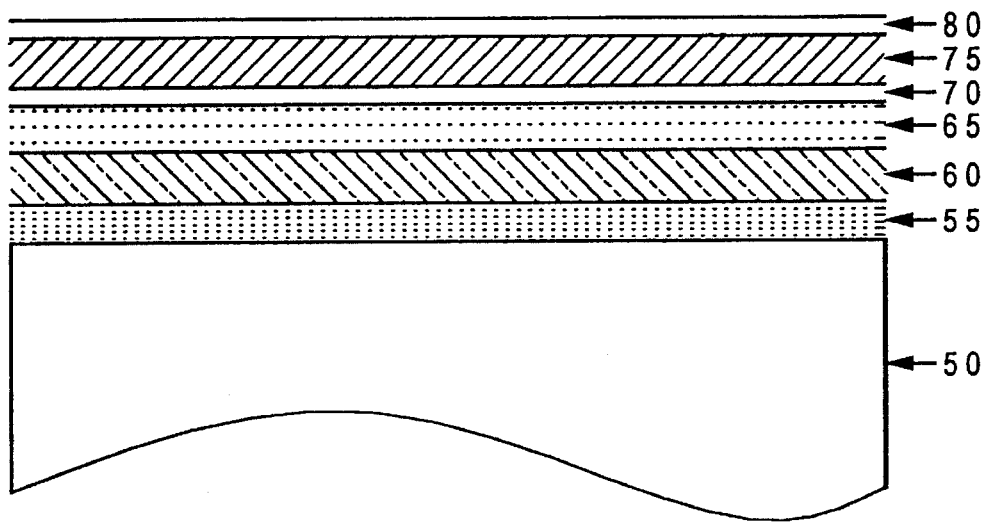
FIG. 4 depicts the multi-layers which comprise the active region of an MR head as deposited using an ion beam induced sputtered deposition process, as required for the first stage in the processing of an MR head according to a preferred embodiment of the present invention.

Referring to FIG. 4, the first stage in the processing of an MR head, that of building the active sensor region, is shown. The MR sensor is to be formed over an underlying region 50. This underlying region 50 can be a substrate, or it can represent underlying layers of the MR device. A magnetic shield layer 55 overlays the substrate 50. A dielectric insulating layer 60 is formed over magnetic shield 55. Insulator layer 60 is typically formed in a relatively thick metal oxide layer, for example 2000 Å of aluminum oxide ($Al_2O_3$).

Soft film layer 65 overlays insulator layer 60. The soft magnetic film layer 65 is used to produce the transverse bias field in the active region. This bias field is normal to the plane of the magnetic media and parallel to the surface of the planar MR sensor. Overlaying soft film layer 65 is spacer layer 70. Spacer layer 70 is a thin non-magnetic spacer layer which prevents magnetic exchange coupling between the MR layer and the soft magnetic bias layer 65 such as tantalum.

Overlaying spacer layer 70 is MR layer 75. MR layer 75 is made of a magnetoresistive material such as nickel-iron (NiFe). Cap layer 80 overlays MR layer 75 to provide protection. Capping layer 80 is typically comprised of a refractory metal such as tantalum.

Figure 5:
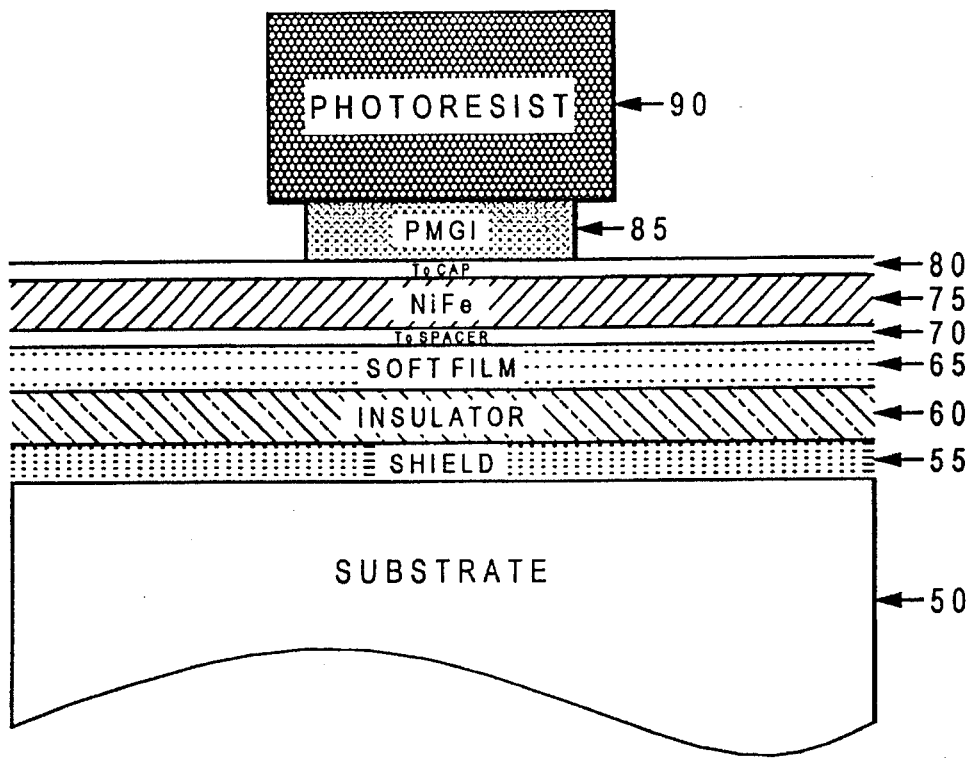
FIG. 5 shows photoresist and PMGI layers overlaying the active region as used in the etching step for processing the MR head according to a preferred embodiment of the present invention.

Referring to FIG. 5, Polydimethylglutarimide (PMGI) layer 85 is formed in between photoresist layer 90 and capping layer 80 in order to facilitate the lift-off process when removing photoresist 90. Photoresist 90 is laid-out over the multi-layers that comprise the active region of the MR sensor. The photoresist masks the active region of the sensor during the etching and deposition process for the conductive lead structures.

Figure 6:
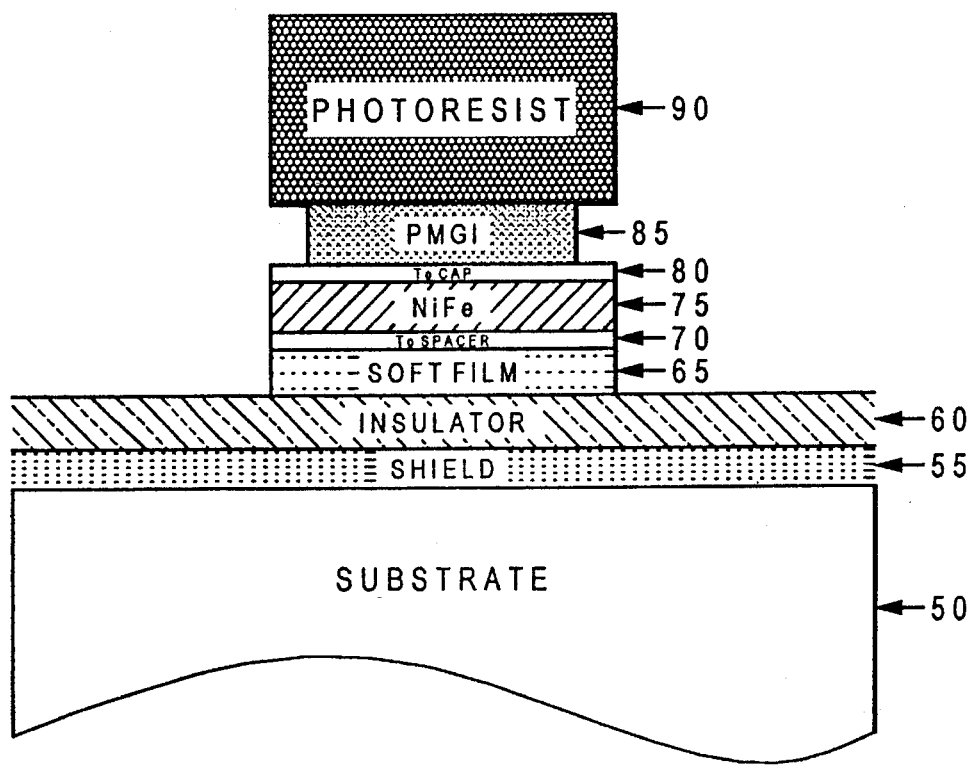
FIG. 6 depicts the multi-layered MR sensor structure after the etching process has been completed.

FIG. 6 depicts the MR sensor after the etching process has been completed. The layers lying under photoresist 90 have been protected during the etching process and remain intact. The portions of soft film layer 65, spacer layer 70, MR layer 75, and capping layer 80 not protected by the photoresist during the etching process have been removed. Insulator layer 60 and shield layer 55 are not affected by the etching process.

Figure 7:
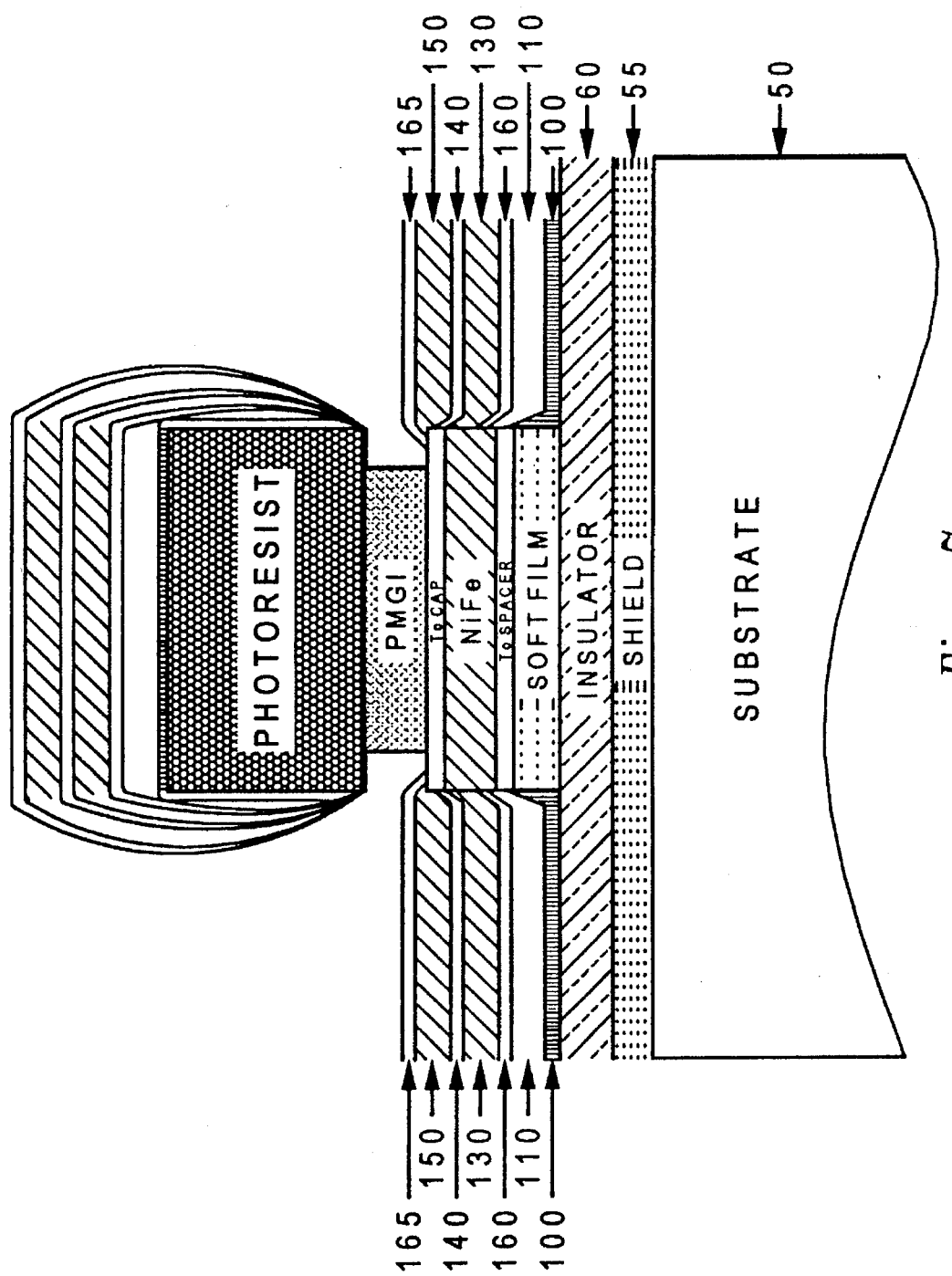
FIG. 7 depicts the MR sensor after the processing step of depositing the biasing and multi-layer conductor lead structure according to a preferred embodiment of the present invention.

Referring now to FIG. 7, depicted is the MR sensor after thin film deposition of the conductive lead structures using an ion beam sputtered deposition process, for example, according to the present invention. First, a chromium layer 100, which overlays insulator 60, is deposited, and hard bias layer 110 is laid over the chromium layer 100. Hard bias layer 110 is a thin layer of a suitable hard magnetic material such as CoPtCr that is deposited in good interfacial contact with the MR layer of NiFe such that the two layers touch.

The present invention comprises at least one interlayer of a refractory metal placed within the current carrying highly conductive metal layers. These interlayers provide strength and stability to the lead structure to resist nodule formation. As the number of strengthening layers interlaid between layers of the highly conductive metal increases, the structure is further strengthened. The mechanical strength required to resist nodule growth is provided by the refractory layers while electrical conductivity is provided primarily by the highly conductive layers. A preferred embodiment of the present invention is embodied in a multi-layered conductive lead structure comprising the highly conductive layer 130, the refractory metal layer 140, and the highly conductive layer 150. In one preferred embodiment, the refractory layers are composed of tantalum and the conductive layers are composed of gold. Refractory layer 140 is interlaid between highly conductive layers 130 and 150 in order to enhance hardness and tensile strength of the conductor lead structures. During the deposition process, these layers are formed over the resist 90 and the PMGI 85. However, at the PMGI a disconnect occurs because of the photoresist 90 overhang.

According to another preferred embodiment of the present invention, additional refractory metal layers may be interlaid into the bulk of the highly conductive metal layers 130 and 150 to further enhance the strengthening and hardening feature. For example, there could be two refractory layers in between three conductive layers. Such a multi-layered conductor lead structure would be constructed by depositing thinner films of gold at layers 130 and 150, and then depositing additional layers alternating between gold and tantalum over refractory metal layer 165.

The addition of refractory layers 160 and 165 in either preferred embodiment, further increases the stability of the structure against nodule growth. Additionally, layer 160 creates a diffusion barrier between hard bias layer 110 and the highly conductive layer 130. Refractory layer 165 acts as a protective layer.

Figure 8:
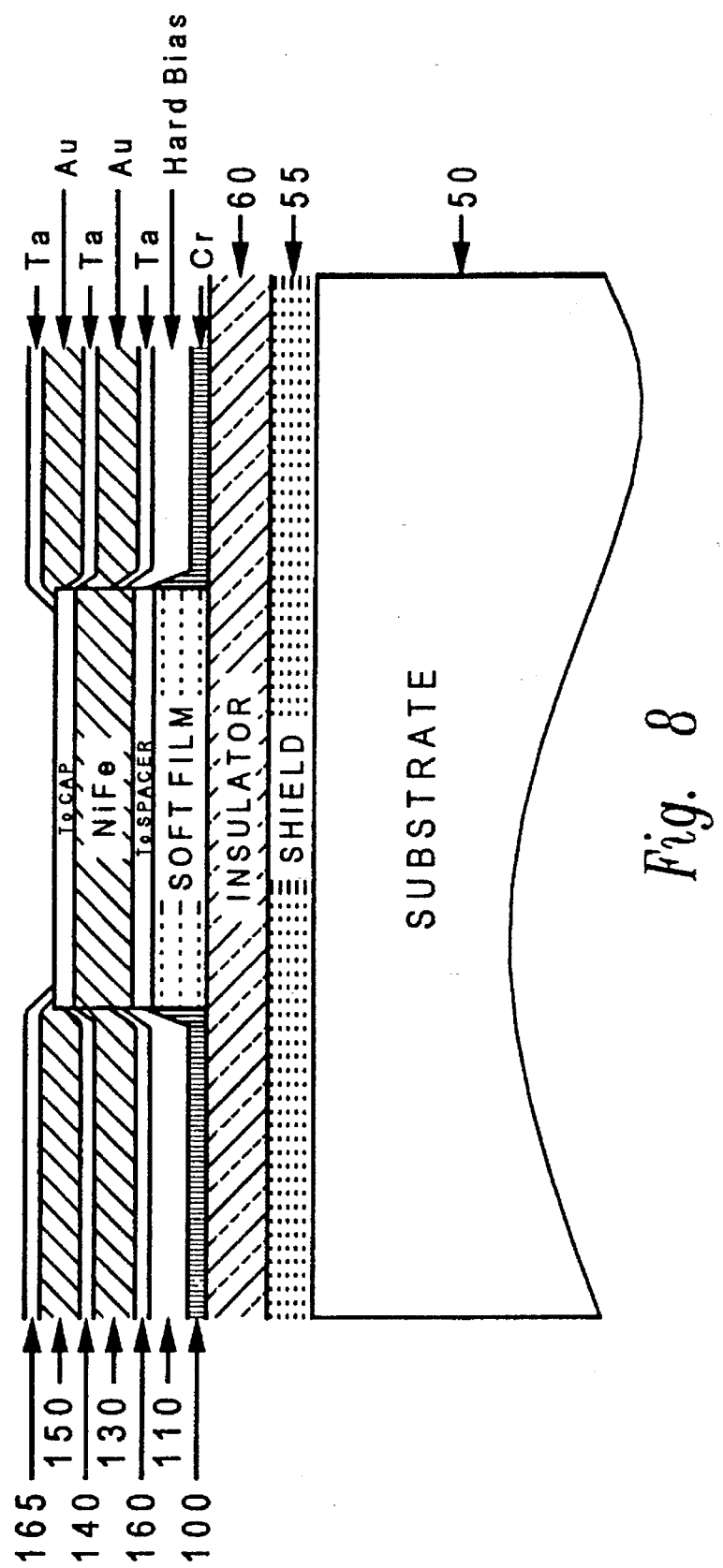
FIG. 8 depicts an MR sensor having a multi-layered conductor lead structure according to the present invention after the photoresist and PMGI have been lifted off.

Referring now to FIG. 8, there is depicted an MR sensor having a multi-layered conductor lead structure according to the present invention. This figure shows the sensor after photoresist 90 has been lifted off. A solution of Methylpyrrolidone (NMP) dissolves PMGI 85 to allow photoresist 90 and the lead structure layers deposited thereon to be washed away. The result is the MR read head structure of FIG. 8.

Figure 9:
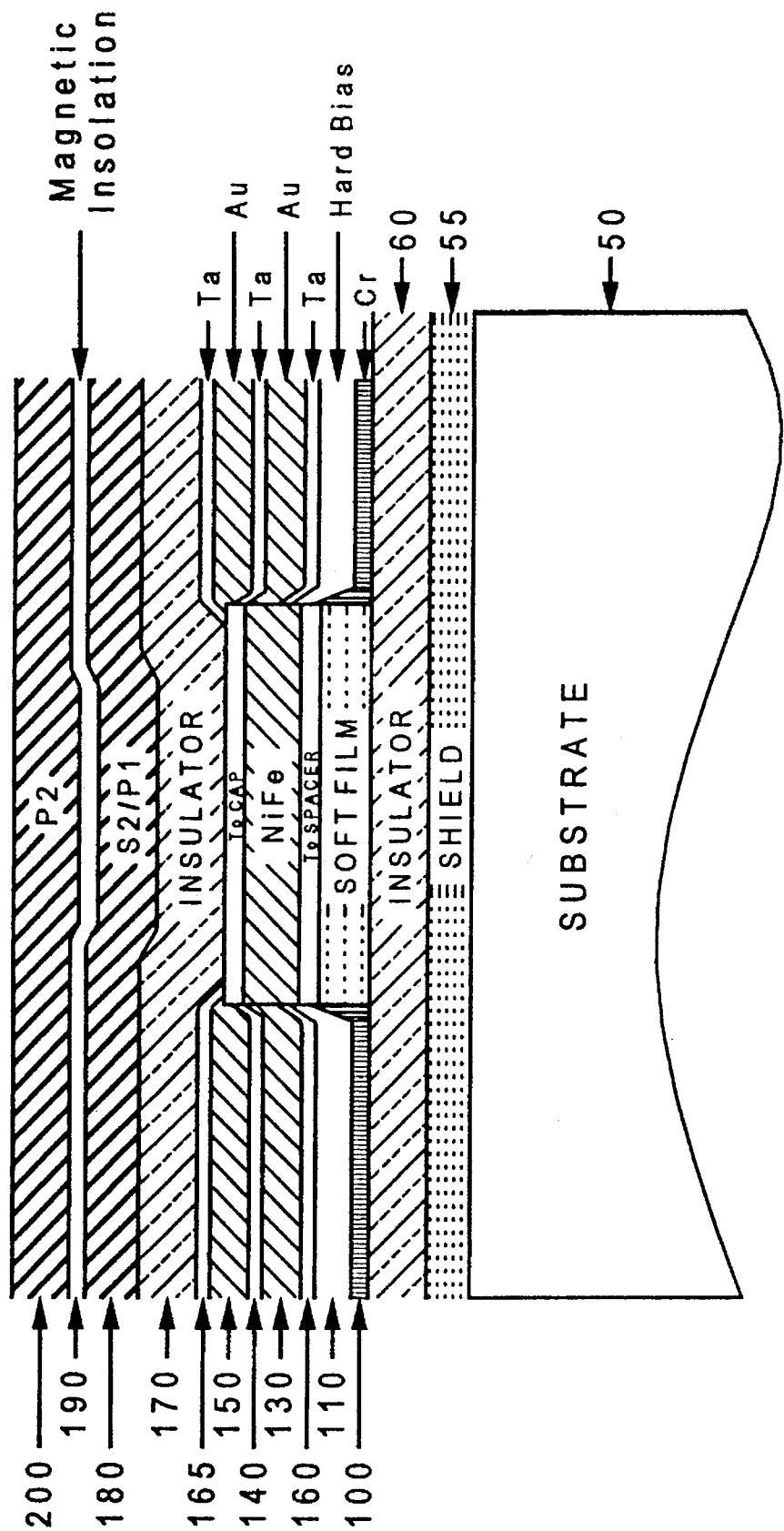
FIG. 9 depicts a merged read/write MR head according to the present invention.

Referring now to FIG. 9, there is depicted a merged read/write MR head of the present invention. Insulator layer 170 is built as a conformal insulator layer over tantalum layer 165 and the tantalum cap. Material used for insulator 170 would typically be a metal oxide such as aluminum oxide. Overlaying insulator 170 is ferromagnetic layer 180 to form both the second (upper) magnetic shield (S2), and the first inductive pole (P1) of the write head. Magnetic isolating material 190 overlays ferromagnetic layer 180 to magnetically isolate ferromagnetic layer 180 from a ferromagnetic layer 200 overlaying magnetic isolating layer 190. Magnetic isolating layer 190 is typically formed of the material aluminum-oxide. Ferromagnetic layer 200 is formed of NiFe and acts as the second inductive pole (P2) of the write head.

FIG. 9 illustrates, in accordance with another aspect of the present invention, the reduction in severe surface topography that is achieved by using ion beam deposition to form the conductor lead structure of the MR head. By using the ion beam sputtering process, the conductor lead thickness much more closely approximates the MR element, thus, reducing the curvature of ferromagnetic layers 180 and 200. Consequently, the read error rate seen in the prior art caused by the curvature of P1 and P2 is improved.

According to another aspect of the present invention, the highly conductive layers 130 and 150 are formed of the highly conductive metals taken from the group consisting of gold, an alloy of gold and nickel, and an alloy of gold and copper. The refractory metal layers of 160, 140 and 165 are formed of a refractory metal taken from the group consisting of tantalum, tungsten, titanium, niobium, and chromium. The refractory metals suitable for application in the present invention must have high conductivity, no diffusion at lower than 300° C., have a high melting point, and be very hard. In a preferred embodiment of the present invention, highly conductive layers 130 and 150 are formed of gold, and refractory layers 160, 140 and 165 are formed of tantalum.

Figures 10A, 10B:
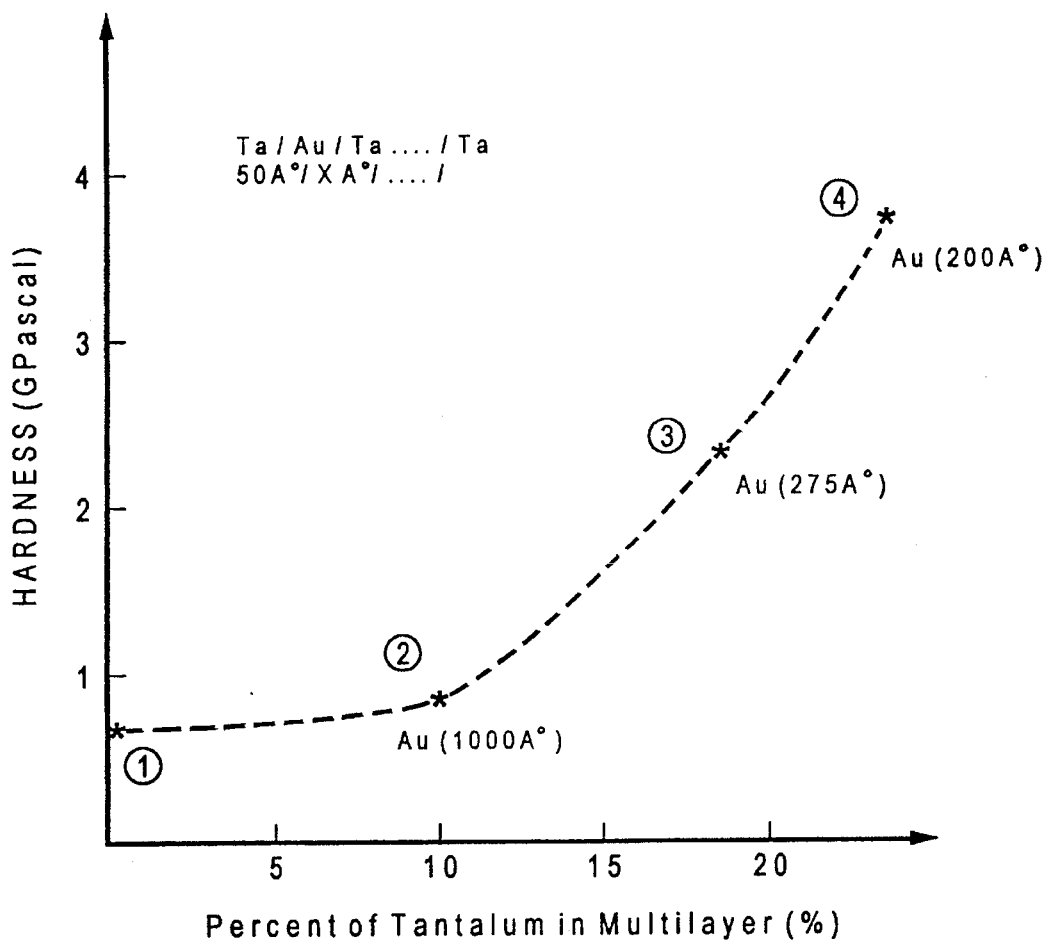
FIG. 10A graphs the hardness of the multi-layer conductive lead structure as a function of the percent of tantalum in the multi-layers of tantalum and gold according to a preferred embodiment of the present invention.
FIG. 10B is a table providing the thicknesses in angstroms of the gold and tantalum layers used in the multi-layered structure tested for hardness in FIG. 10A.

Referring now to FIG. 10A and 10B, the relationship is shown between the percentage of tantalum in the multi-layered conductive lead structure and the hardness of the lead structure. FIG. 10A graphs hardness of the structure as a function of the percent of tantalum in the multi-layers. Gold conductive layers were used with multiple inner layers of tantalum. Also, an overlayer and underlayer of tantalum were laminated to the structure. FIG. 10B gives the thicknesses in Angstroms for each tantalum and gold layer in the multi-layered structure, and the total number of layers for the conductor lead structures graphed in FIG. 10A. Point 1 in the graph of FIG. 10A shows that the hardness of a pure gold 1800 Å conductor lead has a hardness of 0.80 GPascals. At point 2 of the graph, the conductor lead again is a pure gold conductor lead but has been laminated with an underlayer and overlayer of 50 Å of tantalum. The addition of the laminating layers has no appreciable effect on hardness. However, as interlayers of tantalum are placed within multiple layers of gold and the ratio of tantalum to gold in the multi-layered structure increases, hardness increases.

Figure 11:
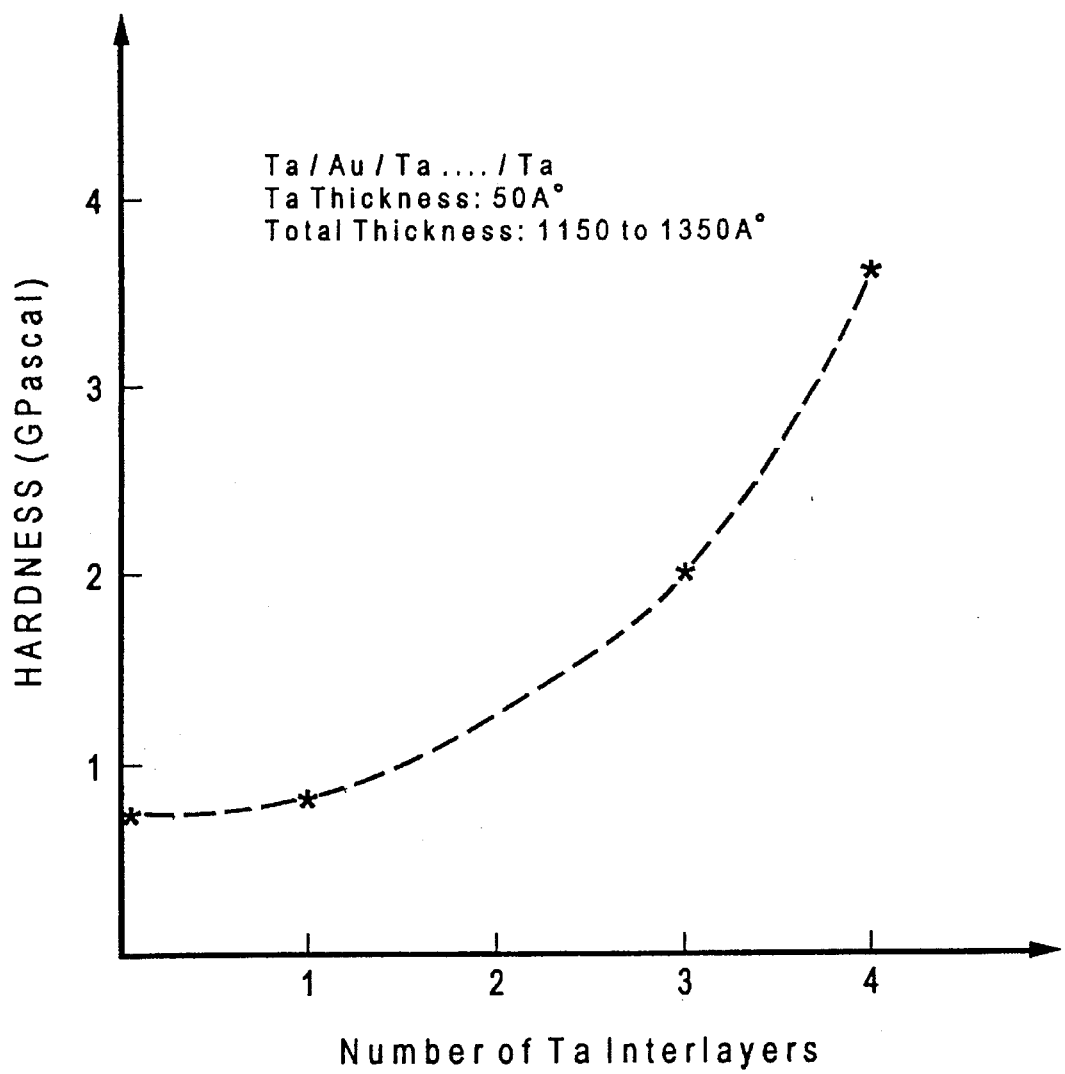
FIG. 11 depicts a graphical relationship between conductor lead hardness and the number of tantalum layers interlaid between gold conductive structures in a preferred embodiment of the conductor lead structure of the present invention.

Referring now to FIG. 11, there is depicted a graphical relationship between conductor lead hardness and the number of tantalum layers interlaid between gold conductive layers. The conductor lead structure alternates between gold and tantalum layers, and includes an underlayer and overlayer of tantalum. The tantalum layers are formed at a thickness of 50 Å. The total lead thickness (the sum of all tantalum and gold layers combined) is held between 1150 Å and 1350 Å. As shown in the graph, hardness of the conductive lead structure increases as the number of tantalum inner layers increases.

Figure 12:
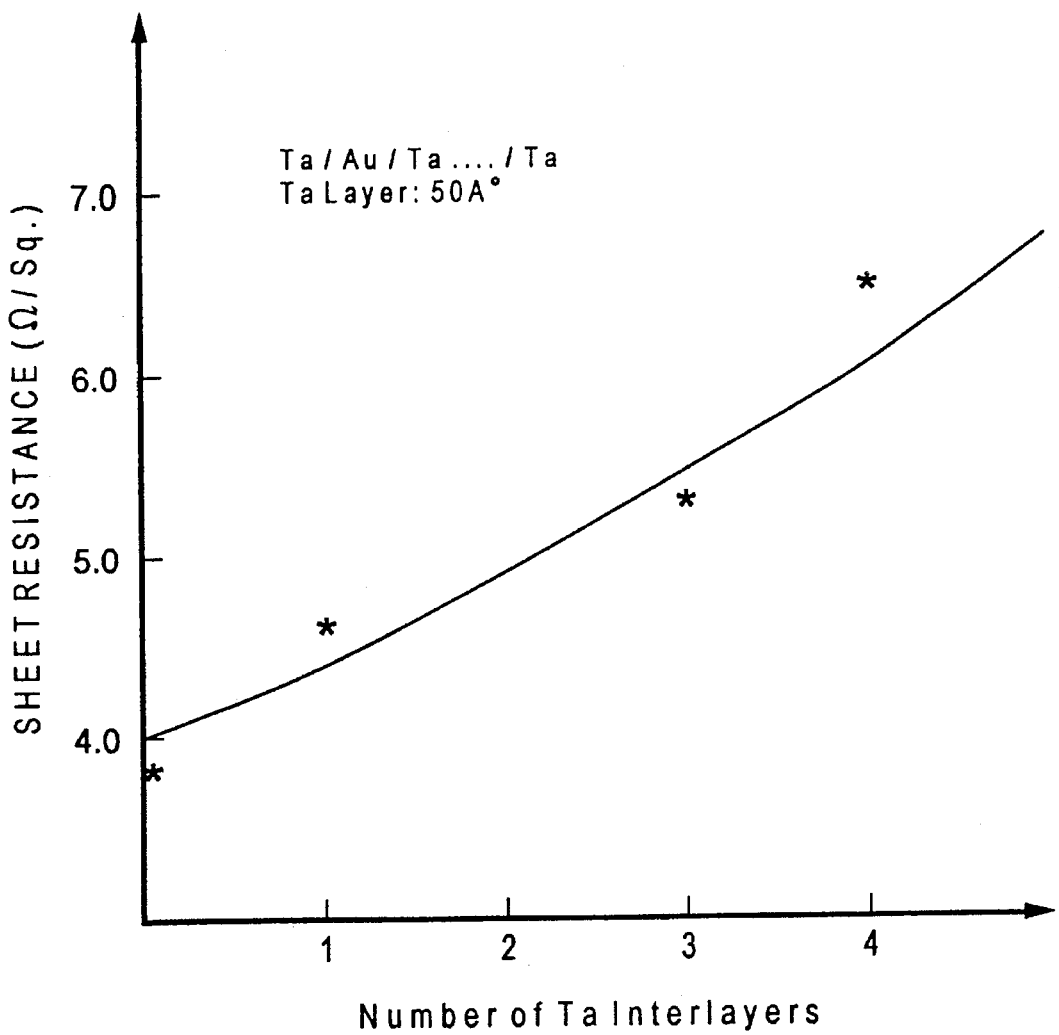
FIG. 12 depicts a graphical relationship between sheet resistance of the conductor lead and the number of tantalum inner layers interlaid between gold conductive layers in a preferred embodiment of the conductor lead structure of the present invention.

As seen in FIG. 12, sheet resistance also increases as the number of tantalum inner layers increases. By balancing the level of hardness required to resist nodule growth and smearing with an acceptable sheet resistance for a particular MR application, the optimum number of tantalum inner layers can be chosen based on this graph. It should be noted that the types of refractory and conductive materials chosen for the multi-layered lead structure also effects this balancing.

An alternative preferred embodiment of the present invention uses a series of binary gold alloys for the highly conductive lead layers in the MR head conductive lead structure of the present invention. These alloys exhibit the desired mechanical and electrical properties for track definition and are very inert in acidic and basic environments. One can choose a gold binary alloy with proper composition to optimize mechanical, electrical and chemical properties for the MR head application.

Figure 13:
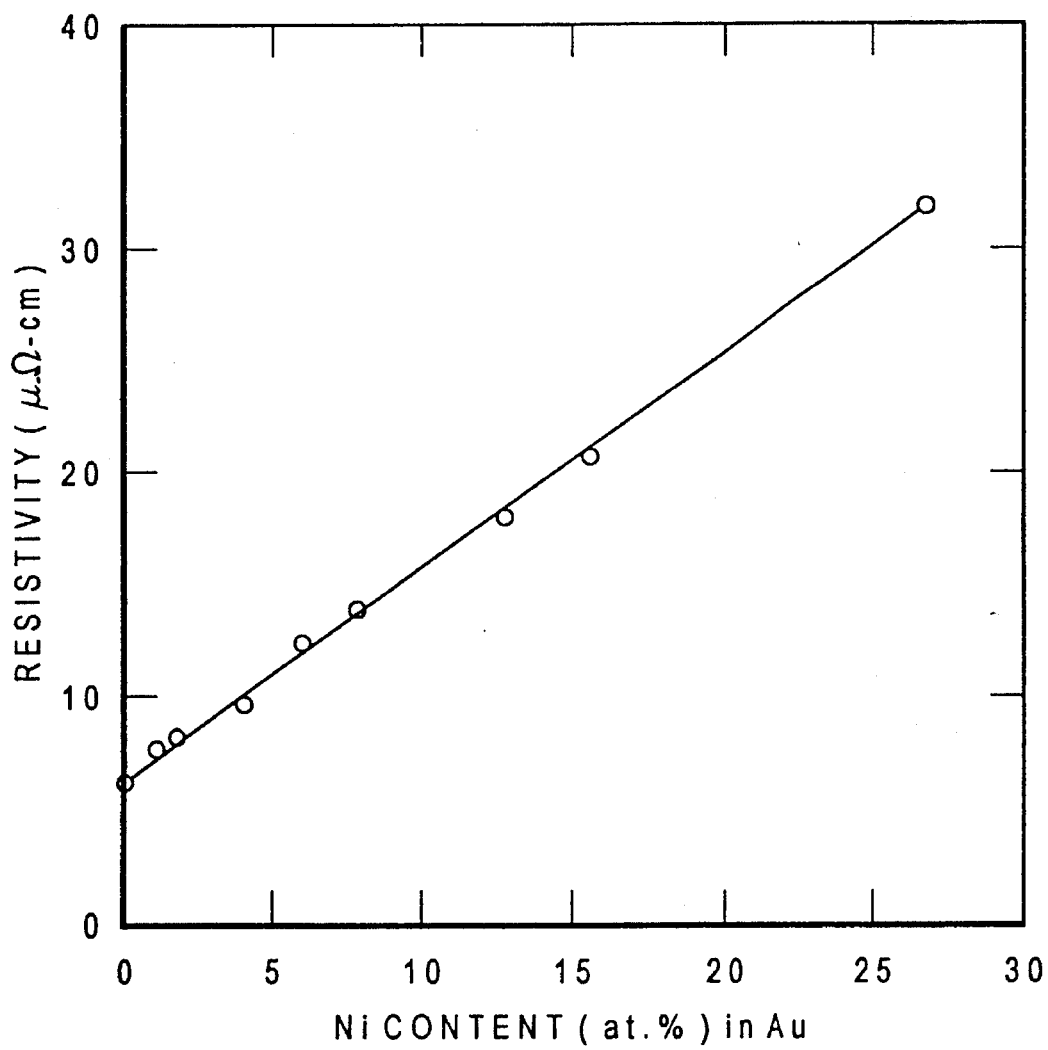
FIG. 13 graphs the resistivity of a AuNi alloy as a function of the nickel content.
Figure 14:
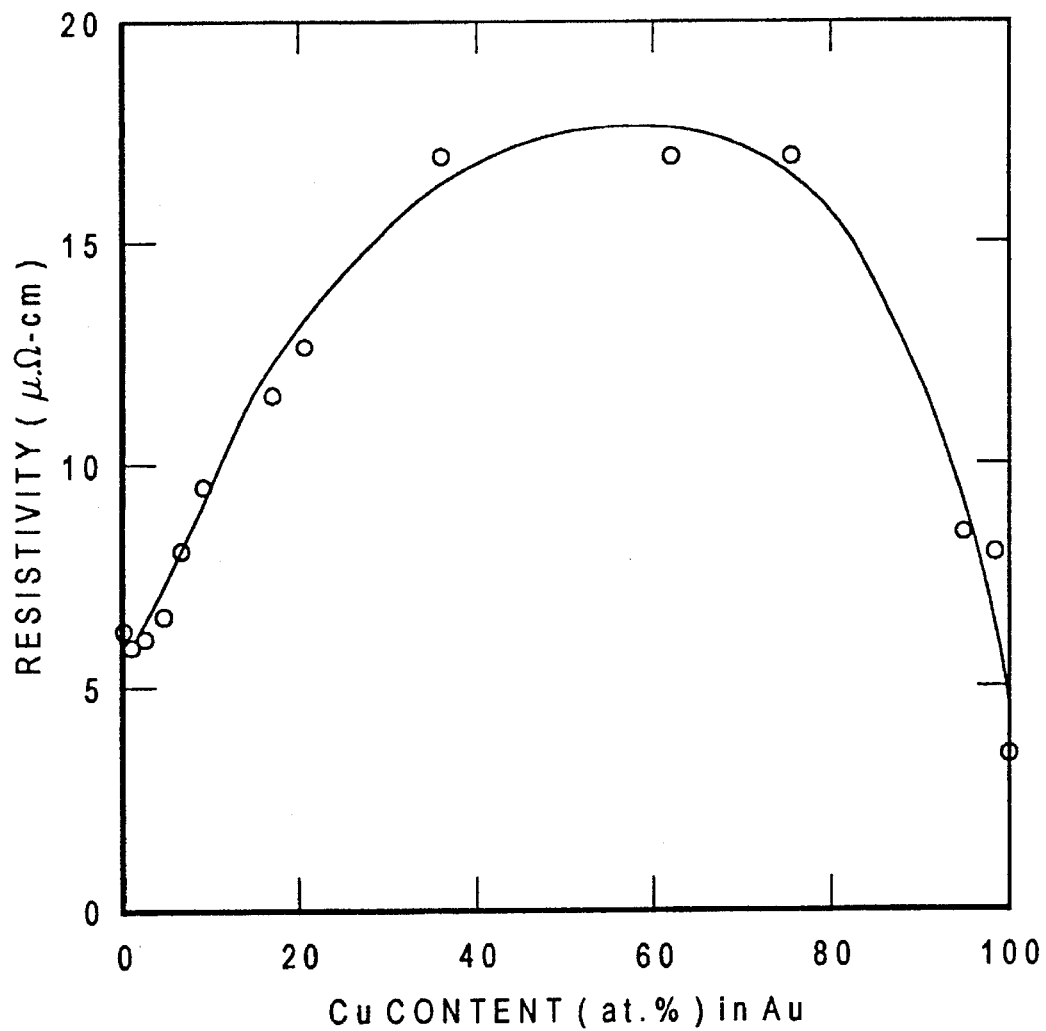
FIG. 14 graphs the resistivity of a AuCu alloy as a function of the copper content.

Referring now to FIGS. 13–16, conventional RF-diode co-sputtering techniques were used to generate a series of AuNi and AuCu alloys of various compositions as depicted in the graphs. FIG. 13 graphs the resistivity of the AuNi alloy as a function of the nickel content. FIG. 14 graphs the resistivity of the AuCu alloy as a function of the copper content. For MR head applications, a film resistivity below 20 micro-ohm-cm is desirable for good track definition and low overall head noise. Therefore, as indicated by FIGS. 13 and 14, a gold binary alloy of up to 50% Cu or 15% Ni should be used as the highly conductive metal in the multi-layer structure.

Figure 15:
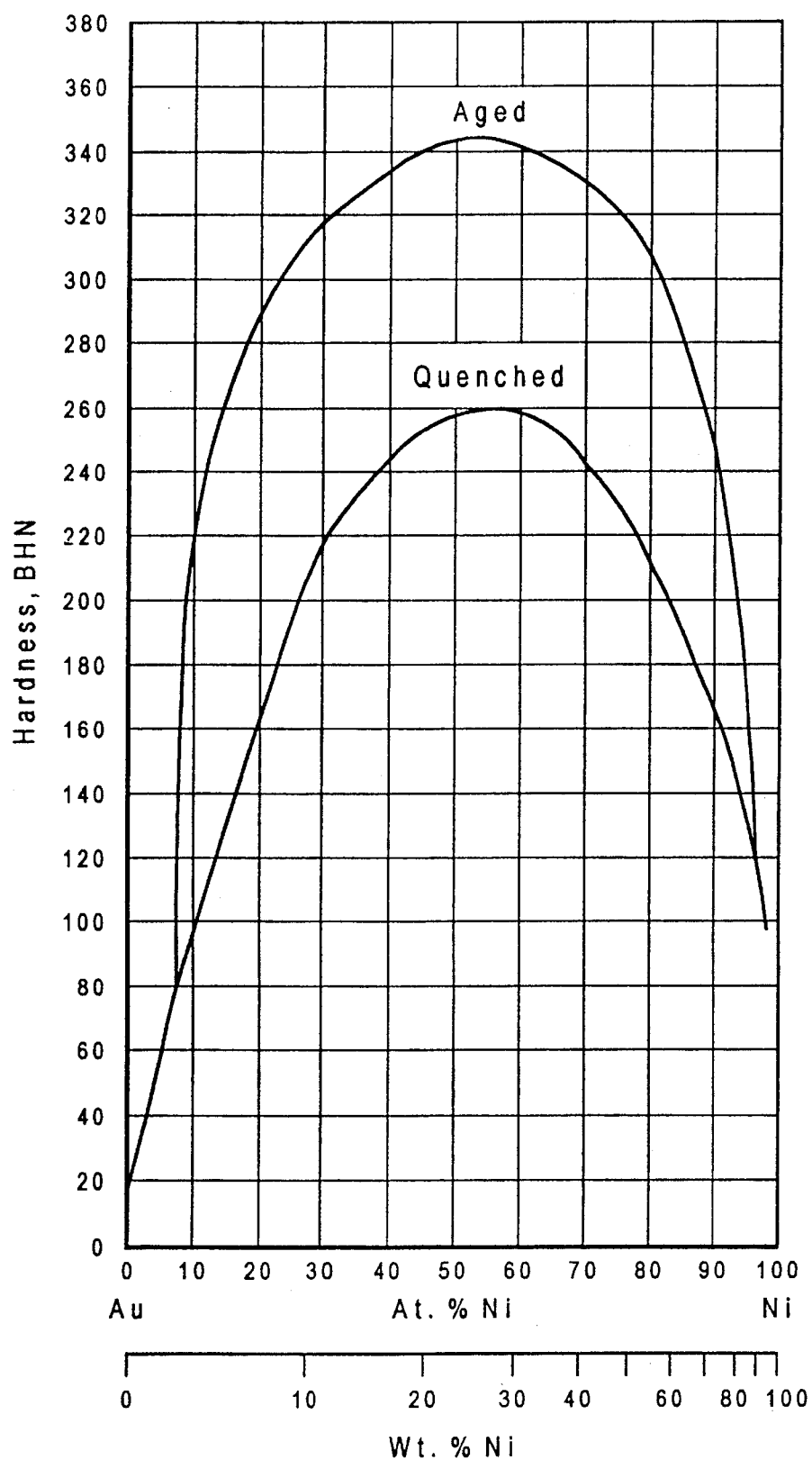
FIG. 15 graphs the hardness for a AuNi alloy versus the percent nickel content.
Figure 16:
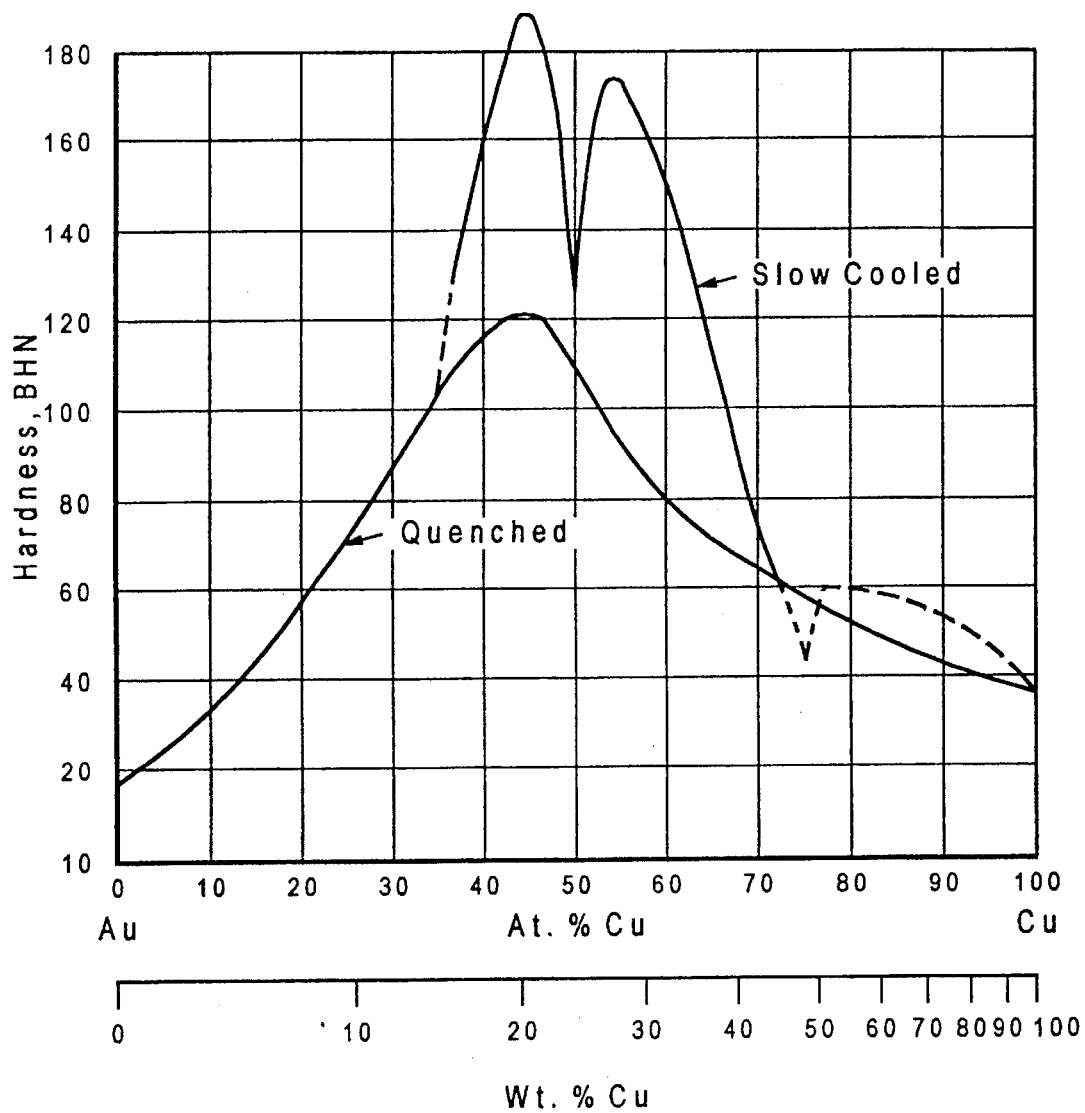
FIG. 16 graphs the hardness for the AuCu alloy versus the percent copper content.

FIG. 15 graphs the hardness for the AuNi alloy versus the percent nickel content. FIG. 16 graphs the hardness for the AuCu alloy versus the percent copper content. For the AuNi alloy, the hardness is at least 5 times that of pure gold in the range from 10–15% nickel. The hardness of the AuCu alloy is greater than 12 times better than pure gold as copper content approaches 50%.

As can be seen from the foregoing, the present invention provides a multi-layer ion beam sputtered gold (or gold alloy) and tantalum structure used for conductor leads applications in an MR head. Deposition of near bulk resistivity/density gold films along with its intrinsically high conductivity provides good sheet conductance while reducing the surface topography to the lowest achievable levels. The addition of one or more interlayers of tantalum deposited in between thin film layers of gold enhances stability, strength and hardness such that nodule formation by the relatively soft conductive layers of gold is prevented.

While the invention has been particularly shown and described with reference to a preferred embodiment, it will be understood by those skilled in the art that various changes in form and detail may be made therein without departing from the spirit and scope of the invention.

What is claimed is:

1. A magnetoresistive sensor comprising:
   a magnetoresistive material, formed on a substrate, having a first edge and a second edge;
   a first hard bias layer;
   a second herd bias layer;
   a first multilayered conductive lead structure formed over the first hard bias layer electrically connected to the first edge; and
   a second multilayered conductive lead structure formed over the second hard bias layer electrically connected to the second edge, wherein the first and second conductive lead structures are constructed of multiple layers of thin film materials, wherein the layers alternate between a thin film of a refractory metal and a thin film of a highly conductive metal, and further wherein the first and second conductive lead structures have a first refractory layer formed in contact with the first and second hard biased layers, respectively, and have at least a second refractory layer interlayered between two layers composed of the highly conductive metal.

2. A magnetoresistive head assembly according to claim 1, wherein the refractory metal is taken from the group consisting of tantalum, tungsten, titanium, niobium, and chromium.

3. A magnetoresistive head assembly according to claim 2, wherein the refractory metal is tantalum.

4. A magnetoresistive head assembly according to claim 1, wherein the highly conductive metal is taken from the group consisting of gold, an alloy of gold and nickel, and an alloy of gold and copper.

5. A magnetoresistive head assembly according to claim 4, wherein the highly conductive metal is gold.

6. A magnetoresistive head assembly according to claim 4, wherein the highly conductive metal is a gold binary alloy in the range from zero (0) to fifty percent (50%) copper (Cu) content.

7. A magnetoresistive head assembly according to claim 6, wherein the highly conductive metal is a gold binary alloy of forty-five percent (45%) copper (Cu) content.

8. A magnetoresistive head assembly according to claim 4, wherein the highly conductive metal is a gold binary alloy in the range from zero (0) to fifteen percent (15%) nickel (Ni) content.

9. A magnetoresistive head assembly according to claim 8, wherein the highly conductive metal is a gold binary alloy of ten percent (10%) nickel (Ni) content.

10. A magnetoresistive head assembly according to claim 1, wherein the refractory metal is tantalum and the highly conductive material is gold, and further wherein the ratio of tantalum layer thickness to gold layer thickness is less than thirty-three percent (33%).

11. A magnetoresistive head assembly according to claim 10, wherein the ratio of tantalum layer thickness to gold layer thickness is greater than ten percent (10%).

12. A magnetoresistive head assembly according to claim 11, wherein the tantalum layer thickness is thirty-five Angstroms (35 Å) and the gold layer thickness is two hundred Angstroms (200 Å).

13. A magnetoresistive head assembly according to claim 1, wherein the magnetoresistive material is comprised of:
   a shield layer overlaying the substrate;
   an insulation layer overlaying the shield layer;
   a soft film layer overlaying the insulation layer;
   a tantalum spacer layer overlaying the soft film layer;
   a nickel-iron layer overlaying the spacer layer; and
   a tantalum cap layer overlaying the nickel-iron layer.

14. A magnetoresistive head assembly according to claim 1, wherein the first and second conductive lead structures are further comprised of:
   a chromium layer overlaying the substrate; and
   a hard-bias material overlaying the chromium layer, wherein the conductive lead structure overlays the hard-bias material.

15. A magnetoresistive head assembly according to claim 14, wherein the hard-bias material is cobalt-platinum-chromium.

16. A magnetic storage system comprising:
   a magnetic storage medium having a plurality of tracks for recording of data; and
   a magnetic transducer maintained in a closely spaced position relative to the magnetic storage medium during relative movement between the magnetic transducer and the magnetic storage medium, the magnetic transducer further including:
   a magnetoresistive material, formed on a substrate, having a first edge and a second edge;
   a first hard bias layer;
   a second hard bias layer;
   a first multilayered conductive lead structure formed over the first hard bias layer electrically connected to the first edge;
   a second multilayered conductive lead structure formed over the second hard bias layer electrically connected to the second edge, wherein the first and second conductive lead structures are constructed of multiple layers of thin film materials, wherein the layers alternate between a thin film of a refractory metal and a thin film of a highly conductive metal, and further wherein the first and second conductive lead structures have a first refractory layer formed in contact with the first and second hard biased layers, respectively, and have at least a second refractory layer interlayered between two layers composed of the highly conductive metal;

actuator means coupled to the magnetic transducer for moving the magnetic transducer to selected tracks on the magnetic storage medium; and means coupled between the first and second multilayered conductive lead structures for detecting resistance changes in the magnetoresistive material responsive to magnetic fields representative of data bits recorded in the magnetic storage medium intercepted by the layer of magnetoresistive material.

17. A magnetic storage system assembly according to claim 16, wherein the refractory metal is taken from the group consisting of tantalum, tungsten, titanium, niobium, and chromium.

18. A magnetic storage system according to claim 16, wherein the highly conductive metal is taken from the group consisting of gold, an alloy of gold and nickel, and an alloy of gold and copper.

19. A magnetic storage system according to claim 16, wherein the refractory metal is tantalum and the highly conductive material is gold, and further wherein the ratio of tantalum layer thickness to gold layer thickness is in the range between ten percent (10%) and thirty-three percent (33%).

20. A magnetic storage system according to claim 19, wherein the tantalum layer thickness is thirty-five Angstroms (35 Å) and the gold layer thickness is two hundred Angstroms (200 Å).

* * * * *